(12) United States Patent
Hiwatari et al.

(10) Patent No.: US 9,403,925 B2
(45) Date of Patent: Aug. 2, 2016

(54) CURABLE COMPOSITION AND CURED ARTICLE

(75) Inventors: Kenichiro Hiwatari, Tokyo (JP); Atsuo Tomita, Tokyo (JP); Tomoaki Saiki, Tokyo (JP); Kiyoshi Murata, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 14/240,804

(22) PCT Filed: Aug. 24, 2012

(86) PCT No.: PCT/JP2012/071486
§ 371 (c)(1),
(2), (4) Date: Feb. 25, 2014

(87) PCT Pub. No.: WO2013/031699
PCT Pub. Date: Mar. 7, 2013

(65) Prior Publication Data
US 2014/0187715 A1 Jul. 3, 2014

(30) Foreign Application Priority Data

Aug. 26, 2011 (JP) ................................. 2011-185262

(51) Int. Cl.
| | | |
|---|---|---|
| *C09D 125/18* | (2006.01) | |
| *C08F 112/34* | (2006.01) | |
| *C08F 228/04* | (2006.01) | |
| *C08K 7/18* | (2006.01) | |
| *C08F 12/22* | (2006.01) | |
| *H01L 29/16* | (2006.01) | |

(52) U.S. Cl.
CPC .............. *C08F 112/34* (2013.01); *C08F 12/22* (2013.01); *C08F 228/04* (2013.01); *C08K 7/18* (2013.01); *C09D 125/18* (2013.01); *H01L 29/1608* (2013.01); *H01L 2924/0002* (2013.01)

(58) Field of Classification Search
CPC ...... C08F 112/34; C08F 228/04; C08F 12/22; C08K 7/18
USPC ........... 524/852, 849, 286, 313, 289
See application file for complete search history.

(56) References Cited

U.S. PATENT DOCUMENTS

| | | | | |
|---|---|---|---|---|
| 4,116,936 | A * | 9/1978 | Steiner .................. | C07C 43/285 526/286 |
| 2004/0001961 | A1 * | 1/2004 | Ono et al. ...................... | 428/500 |
| 2011/0224333 | A1 | 9/2011 | Kitagawa et al. | |

FOREIGN PATENT DOCUMENTS

| | | | | |
|---|---|---|---|---|
| JP | 57209927 | A | * | 12/1982 |
| JP | 63-210111 | A | | 8/1988 |
| JP | 63210111 | A | * | 8/1988 |
| JP | 03140313 | A | * | 6/1991 |
| JP | 2000-258932 | A | | 9/2000 |
| JP | 2001048656 | A | * | 2/2001 |
| JP | 2004-27145 | A | | 1/2004 |
| JP | 2004-189901 | A | | 7/2004 |
| JP | 2004189901 | A | * | 7/2004 |
| JP | 2004-323730 | A | | 11/2004 |
| JP | 2004-331774 | A | | 11/2004 |
| JP | 2004323730 | A | * | 11/2004 |
| JP | 2004331774 | A | * | 11/2004 |
| JP | 2005-36085 | A | | 2/2005 |
| JP | 2006-269730 | A | | 10/2006 |
| JP | 2007-2187 | A | | 1/2007 |
| JP | 2007-15945 | A | | 1/2007 |
| JP | 2007002187 | A | * | 1/2007 |
| JP | 2007015945 | A | * | 1/2007 |
| JP | 2010-202778 | A | | 9/2010 |
| JP | 2010202778 | A | * | 9/2010 |
| JP | 2010-222392 | A | | 10/2010 |
| JP | 2011-184650 | A | | 9/2011 |

\* cited by examiner

*Primary Examiner* — Kelechi Egwim
(74) *Attorney, Agent, or Firm* — Birch, Stewart, Kolasch & Birch, LLP

(57) ABSTRACT

Provided are: a curable composition from which a cured article having excellent molding processability and high heat resistance as well as such a high Tg that it can be used as a molding resin for a SiC power semiconductor can be obtained; and a cured article thereof. The curable composition comprises: 100 parts by mass of a compound having at least two partial structures represented by the following Formula (1) in the molecule as a component (A); 0.5 to 3 parts by mass of a thermal radical generator as a component (B); and 0 to 50 parts by mass of other radical-reactive compound as a component (C):

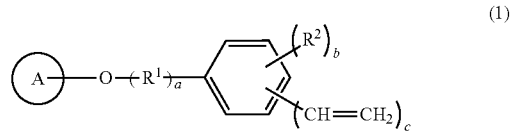

(1)

(wherein, ring A represents a benzene ring or a cyclohexyl ring; $R^1$ represents an alkylene group having 1 to 6 carbon atoms; $R^2$ represents an alkyl group having 1 to 4 carbon atoms; a represents a number of 0 or 1; b represents an integer of 0 to 3; and c represents a number of 1 or 2).

9 Claims, No Drawings

CURABLE COMPOSITION AND CURED ARTICLE

TECHNICAL FIELD

The present invention relates to a curable composition and a cured article thereof. More particularly, the present invention relates to a curable composition from which a cured article having excellent molding processability and high heat resistance can be obtained, and a cured article thereof.

BACKGROUND ART

SiC (silicon carbide) shows a lower electrical insulation and a smaller energy loss at the time of electrification as compared to silicon and thus has a smaller calorific value as well as higher heat resistance. Therefore, as compared to silicon power semiconductors, SiC power semiconductors are capable of handling a larger electric power, so that SiC power semiconductors are being actively studied as next-generation power semiconductors that would replace silicon power semiconductors that are widely used at present. The heat-resistance limit temperature of silicon power semiconductor devices is about 150° C.; however, in SiC power semiconductor devices, the use thereof at a temperature of 240 to 300° C. is being investigated so as to handle a larger electric power, and heat resistance of higher than 240° C. is demanded also for the members of SiC power semiconductor devices.

Conventionally, as a molding resin of a semiconductor obtained by molding a resin, an epoxy resin is mainly used. In general, the physical properties of a resin, such as viscoelasticity and thermal expansion coefficient, largely changes across its Tg (glass transition temperature); therefore, it is required that the Tg of a molding resin be higher than the service temperature of the semiconductor. However, since the Tg of conventional epoxy resins is about 200° C. or lower, there are problems of material softening, crack generation and the like under such a service environment where the temperature exceeds 240° C. (see, for example, Patent Documents 1 and 2). In addition, since epoxy resins having a Tg of 240° C. or higher have high pre-curing melting points, their curing temperatures are also high and curing requires a long time, so that there are problems that other members are adversely affected and the productivity is reduced (see, for example, Patent Document 3). Furthermore, although the use of resins other than epoxy resins, such as polyimide, has also been studied (see, for example, Patent Document 4), such resins are not satisfactory in terms of required performance.

Meanwhile, curable compositions containing a vinylbenzyl ether compound of a polyvalent phenol compound are also known (see, for example, Patent Documents 5 to 7); however, all of these curable compositions have a Tg of lower than 240° C. and are thus not satisfactory as molding resins of SiC powder semiconductors.

RELATED ART DOCUMENTS

Patent Documents

Patent Document 1: Japanese Unexamined Patent Application Publication No. 2005-036085
Patent Document 2: Japanese Unexamined Patent Application Publication No. 2006-269730
Patent Document 3: Japanese Unexamined Patent Application Publication No. 2011-184650
Patent Document 4: Japanese Unexamined Patent Application Publication No. 2010-222392
Patent Document 5: Japanese Unexamined Patent Application Publication No. 2000-258932
Patent Document 6: Japanese Unexamined Patent Application Publication No. 2004-189901
Patent Document 7: Japanese Unexamined Patent Application Publication No. 2010-202778

SUMMARY OF THE INVENTION

Problems to be Solved by the Invention

Therefore, an object of the present invention is to provide a curable composition from which a cured article having excellent molding processability and high heat resistance as well as such a high Tg that it can be used as a molding resin for a SiC power semiconductor can be obtained; and a cured article thereof.

Means for Solving the Problems

In view of the above-described problems, the present inventors intensively studied to discover that a curable composition comprising a compound having a specific structure has excellent molding processability and high post-curing heat resistance, thereby completing the present invention. That is, the present invention provides a curable composition which comprises: 100 parts by mass of a compound having at least two partial structures represented by the following Formula (1) in the molecule as a component (A); 0.5 to 3 parts by mass of a thermal radical generator as a component (B); and 0 to 50 parts by mass of other radical-reactive compound as a component (C):

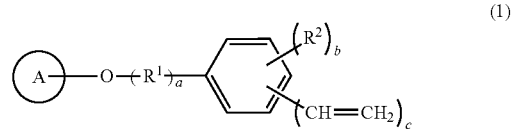

(1)

(wherein, ring A represents a benzene ring or a cyclohexyl ring; $R^1$ represents an alkylene group having 1 to 6 carbon atoms; $R^2$ represents an alkyl group having 1 to 4 carbon atoms; a represents a number of 0 or 1; b represents an integer of 0 to 3; and c represents a number of 1 or 2).

In the curable composition according to the present invention, it is preferred that the above-described component (A) be a compound represented by the following Formula (2) or (3):

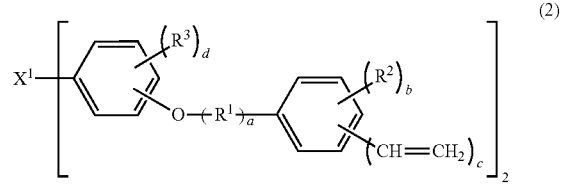

(2)

(wherein, $R^3$ represents an alkyl group having 1 to 4 carbon atoms; d represents an integer of 0 to 2; $X^1$ represents an oxygen atom, a sulfur atom, a sulfinyl group, a sulfonyl group, a carbonyl group, a phenylene group, a cyclohexylene group (however, 1,1-cyclohexylene group is excluded), a group represented by the following Formula (4) or a direct bond; and $R^1$, $R^2$, a, b and c have the same meanings as in the Formula (1))

(wherein, $R^4$ and $R^5$ each independently represent a hydrogen atom, a trifluoromethyl group or a hydrocarbon group having 1 to 12 carbon atoms, with a proviso that, when $R^4$ and $R^5$ are hydrocarbon groups having 1 to 12 carbon atoms, $R^4$ and $R^5$ are optionally linked with each other)

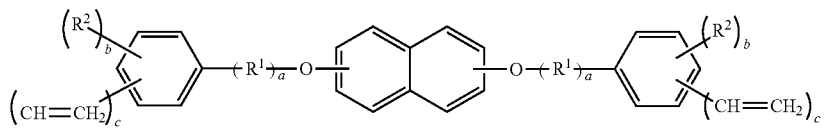

(wherein, R', $R^2$, a, b and c have the same meanings as in the Formula (1)).

It is also preferred that the curable composition according to the present invention further comprise a filler as a component (D).

The tablet for transfer molding according to the present invention is composed of the above-described curable composition.

The cured article according to the present invention is obtained by curing the above-described curable composition.

The semiconductor element according to the present invention is obtained by molding a cured article of the above-described curable composition.

Effects of the Invention

According to the present invention, a curable composition from which a cured article having excellent molding processability and high heat resistance can be obtained and a cured article thereof can be provided. The curable composition of the present invention is useful particularly as a molding material for semiconductors and the like.

MODE FOR CARRYING OUT THE INVENTION

The curable composition of the present invention is a curable composition which comprises: a compound having at least two partial structures represented by the above-described Formula (1) in the molecule as a component (A); a radical generator as a component (B); and, optionally, other radical-reactive compound as a component (C).

First, the component (A) will be described. In the above-described Formula (1), R' represents an alkylene group having 1 to 6 carbon atoms. Examples of the alkylene group having 1 to 6 carbon atoms include a methylene group, an ethylene group, a propylene group, a butylene group, a pentylene group, a hexylene group, a 1-methylethylene group, a 2-methylethylene group, a 2-methylpropylene group and a 2,2-dimethylpropylene group. From the standpoint of the ease of production, $R^1$ is preferably a methylene group. $R^2$ represents an alkyl group having 1 to 4 carbon atoms and b represents an integer of 0 to 3. From the standpoint of the material availability, b is preferably 0. Examples of the alkyl group having 1 to 4 carbon atoms include a methyl group, an ethyl group, a propyl group, an isopropyl group, a butyl group, a 1-methylpropyl group, an isobutyl group and a t-butyl group.

In the above-described Formula (1), a represents a number of 0 or 1 and c represents a number of 1 or 2. From the standpoint of the ease of production, a is preferably 1. Further, c is preferably 1 because good storage stability is attained and an abnormal reaction is not likely to occur during a curing reaction of the curable composition of the present invention.

In the above-described Formula (1), the ring A represents a benzene ring or a cyclohexyl ring and, from the standpoint of improving the heat resistance, the ring A is preferably a benzene ring. The component (A) of the present invention is a compound having at least two partial structures represented by the above-described Formula (1) in the molecule, in which the ring A or a part thereof is optionally overlapping. From the standpoint of reducing the thermal expansion coefficient of the resulting cured article, it is preferred that the component (A) of the present invention be a compound having two partial structures represented by the above-described Formula (1) in the molecule.

The compound having at least two partial structures represented by the above-described Formula (1) in the molecule can be rephrased as "a compound having at least two partial structures represented by the following Formula (1a) in the molecule, in which the hydrogen atom of the hydroxyl group is substituted with a group represented by the Formula (1b)":

(wherein, ring A has the same meaning as in the Formula (1))

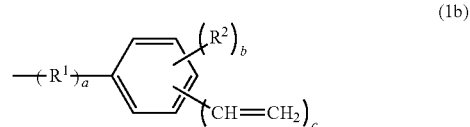

(wherein, $R^1$, $R^2$, a, b and c have the same meanings as in the Formula (1)).

Among compounds having at least two partial structures represented by the above-described Formula (1a) in the molecule, from the standpoint of reducing the thermal expansion coefficient of the resulting cured article, those compounds that are represented by the following Formula (2a) or (3a) are more preferred:

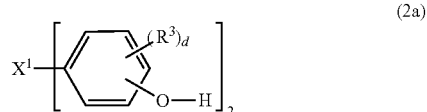

(wherein, $R^3$ represents an alkyl group having 1 to 4 carbon atoms; d represents an integer of 0 to 2; $X^1$ represents an oxygen atom, a sulfur atom, a sulfinyl group, a sulfonyl group, a carbonyl group, a phenylene group, a cyclohexylene group (however, 1,1-cyclohexylene group is excluded), a group represented by the following Formula (4) or a direct bond)

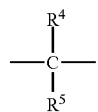

(4)

(wherein, $R^4$ and $R^5$ each independently represent a hydrogen atom, a trifluoromethyl group or a hydrocarbon group having 1 to 12 carbon atoms, with a proviso that, when $R^4$ and $R^5$ are hydrocarbon groups having 1 to 12 carbon atoms, $R^4$ and $R^5$ are optionally linked with each other).

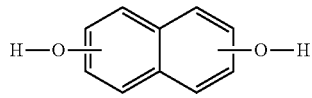

(3a)

In the above-described Formula (2a), $R^3$ represents an alkyl group having 1 to 4 carbon atoms. Examples of the alkyl group having 1 to 4 carbon atoms include the same groups as those exemplified for $R^2$ of the above-described Formula (1) and, from the standpoint of attaining good heat resistance, $R^3$ is preferably a methyl group or a t-butyl group. Further, d represents an integer of 0 to 2 and, from the standpoint of reducing the thermal expansion coefficient of a cured article obtained from the curable composition of the present invention, d is preferably 0. $X^1$ represents an oxygen atom, a sulfur atom, a sulfonyl group, a sulfonyl group, a carbonyl group, a phenylene group, a cyclohexylene group (however, 1,1-cyclohexylene group is excluded), a group represented by the above-described Formula (4) or a direct bond. From the standpoint of reducing the thermal expansion coefficient of a cured article obtained from the curable composition of the present invention, it is preferred that the hydroxyl groups of the above-described Formula (2a) be each bound at para-position to $X^1$.

Examples of the phenylene group include a 1,2-phenylene group, a 1,3-phenylene group and a 1,4-phenylene group. Examples of the cyclohexylene group (however, 1,1-cyclohexylene group is excluded) include 1,2-cyclohexylene group, 1,3-cyclohexylene group and 1,4-cyclohexylene group.

In the above-described Formula (4), $R^4$ and $R^5$ each independently represent a hydrogen atom, a trifluoromethyl group or a hydrocarbon group having 1 to 12 carbon atoms. However, when $R^4$ and $R^5$ are hydrocarbon groups having 1 to 12 carbon atoms, $R^4$ and $R^5$ are optionally linked with each other. Examples of the group represented by the Formula (4) include the following groups:

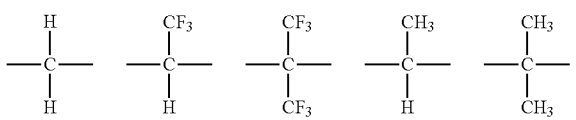

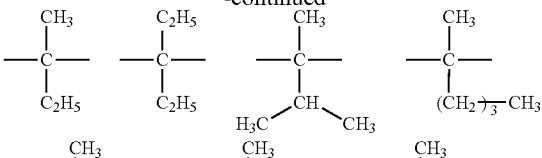

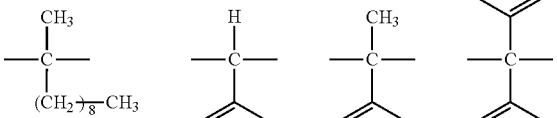

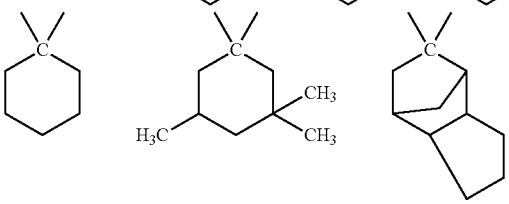

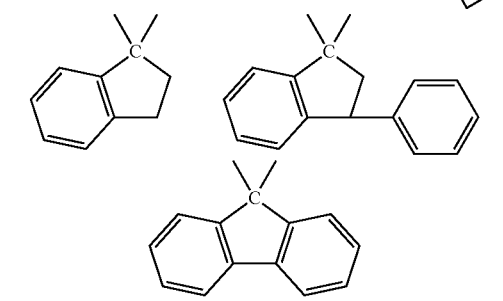

Among those compounds represented by the above-described Formula (2a), examples of a compound in which $X^1$ is an oxygen atom include bis(2-hydroxyphenyl)ether and bis(4-hydroxyphenyl)ether.

Among those compounds represented by the above-described Formula (2a), examples of a compound in which $X^1$ is a sulfur atom, a sulfinyl group or a sulfonyl group include 2,4'-dihydroxydiphenyl sulfide, 4,4'-dihydroxydiphenyl sulfide (also referred to as "bisphenol T"), 4,4'-dihydroxydiphenyl sulfoxide, 2,2'-dihydroxydiphenyl sulfone, 2,4'-dihydroxydiphenyl sulfone and 4,4'-dihydroxydiphenyl sulfone (also referred to as "bisphenol S").

Among those compounds represented by the above-described Formula (2a), examples of a compound in which $X^1$ is a carbonyl group include 2,4'-dihydroxybenzophenone and 4,4'-dihydroxybenzophenone.

Among those compounds represented by the above-described Formula (2a), examples of a compound in which $X^1$ is a phenylene group include 4,4'-(1,2-phenylene)bisphenol, 4,4'-(1,3-phenylene)bisphenol and 4,4'-(1,4-phenylene)bisphenol.

Among those compounds represented by the above-described Formula (2a), examples of a compound in which X' is a cyclohexylene group (however, 1,1-cyclohexylene group is excluded) include 4,4'-(1,2-cyclohexylene)bisphenol, 4,4'-(1,3-cyclohexylene)bisphenol and 4,4'-(1,4-cyclohexylene)bisphenol.

Among those compounds represented by the above-described Formula (2a), examples of a compound in which $X^1$ is a direct bond include biphenyl-2,2'-diol, biphenyl-2,4'-diol and biphenyl-4,4'-diol.

Among those compounds represented by the above-described Formula (2a), examples of a compound in which $X^1$ is a group represented by the above-described Formula (4) include 2,2'-methylenebisphenol, 2,4'-methylenebisphenol, 4,4'-methylenebisphenol, 2,2'-ethylenebisphenol, 2,4'-ethylenebisphenol, 4,4'-ethylenebisphenol, 4,4'-ethylidenebisphenol, 2,4'-isopropylidenebisphenol, 4,4'-isopropylidenebisphenol (also referred to as "bisphenol A"), 4,4'-butylidenebisphenol, 4,4'-isobutylidenebisphenol, 4,4'-sec-butylidenebisphenol (also referred to as "bisphenol B"), 4,4'-isopropylidenebis(2-methylphenol) (also referred to as "bisphenol C"), 4,4'-(1,3-dimethylbutylidene)bisphenol (also referred to as "Bis MIBK"), 4,4'-hexylidenebisphenol, 4,4'-(1-methylpentylidene)bisphenol, 4,4'-(1-methylhexylidene)bisphenol, 4,4'-heptylidenebisphenol, 4,4'-isopropylidenebis(2,6-dimethylphenol) (also referred to as "bisxylenol A"), 4,4'42-ethylhexylidene)bisphenol, 4,4'-octylidenebisphenol, 4,4'-(1-methyloctylidene)bisphenol, 4,4'-isopropylidenebis(3-t-butylphenol), 4,4'-(1-phenylethylidene)bisphenol, 4,4'-(1-phenylethylidene)bisphenol (also referred to as "bisphenol AP"), 4,4'-(1-phenylethylidene)bis(3-t-butylphenol), 4,4'-(1-benzylethylidene)bisphenol, 4,4'-(1-(4-methyl)phenylethylidene)bis(3-t-butylphenol), 4,4'-(1-(4-phenyl)phenylethylidene)bis(3-t-butylphenol), 4,4'-dihydroxytetraphenyl methane, 4,4'-cyclohexylidene diphenol, 4,4'-(3,3,5-trimethylcyclohexylidene)diphenol, 4,4'-(2-norbornylidene)diphenol, 4,4'-(octahydro-4,7-methano-5H-indene-5-ylidene)bisphenol, 4,4'-(indan-1-ylidene)diphenol, 4,4'-(3-phenylindan-1-ylidene)diphenol, 4,4'-(fluorene-9-ylidene)diphenol and 6,6'-dihydroxy-3,3,3',3'-tetramethyl-1,1'-spirobiindan.

Since a cured article having a high glass transition temperature can be obtained, among those compounds represented by the above-described Formula (2a), ones in which $X^1$ is a sulfur atom, a sulfonyl group, a phenylene group, a group represented by the Formula (4) or a direct bond are preferred and, among those groups represented by the Formula (4), ones in which at least either of $R^4$ and $R^5$ is a hydrocarbon group having a benzene ring are preferred.

Examples of a compound represented by the Formula (3a) include naphthalene-1,2-diol, naphthalene-1,3-diol, naphthalene-1,4-diol, naphthalene-1,5-diol, naphthalene-1,6-diol, naphthalene-1,8-diol, naphthalene-2,3-diol, naphthalene-2,6-diol and naphthalene-2,7-diol. It is noted here that the compound represented by the Formula (3a) is a compound in which a part of the ring A is overlapping.

Since a cured article having a high glass transition temperature can be obtained, among those compounds represented by the above-described Formula (2a) or (3a), compounds represented by the Formula (2a) in which $X^1$ is a sulfur atom, a sulfonyl group, a phenylene group, a group represented by the Formula (4) or a direct bond or compounds represented by the Formula (3a) are preferred, and compounds represented by the Formula (2a) in which $X^1$ is a group represented by the Formula (4) are more preferred. Among such compounds represented by the Formula (2a) in which $X^1$ is a group represented by the Formula (4), ones in which at least either of $R^4$ and $R^5$ is a hydrocarbon group having a benzene ring are preferred, and ones in which either $R^4$ or $R^5$ is a phenyl group and the other is a methyl group are more preferred.

Among those compounds having at least two partial structures represented by the above-described Formula (1a) in the molecule, examples of a compound that is not a compound represented by the above-described Formula (2a) or (3a) include cyclohexane ring-containing diol compounds such as 1,2-cyclohexanediol, 1,3-cyclohexanediol, 1,4-cyclohexanediol, 4,4'-dicyclohexanediol, 2,2'-isopropylidene dicyclohexanol, 4,4'-isopropylidene dicyclohexanol (also referred to as "hydrogenated bisphenol A"), bicyclo[2,2,1]heptane-2,3-diol, bicyclo[2,2,1]heptane-2,5-diol, bicyclo[2,2,1]heptane-2,7-diol, octahydro-4,7-methano-1H-indene-5,6-diol, adamantane-1,3-diol, 1,2,3,4-tetrahydronaphthalene-1,5-diol, 1,2,3,4-tetrahydronaphthalene-5,8-diol and 1,5-decalindiol;

benzenediol compounds such as 1,2-benzenediol, 1,3-benzenediol, 1,4-benzenediol and 2-methyl-1,3-benzenediol;

diphenol compounds such as 4,4'-(1,1,3-trimethyltrimethylene)bisphenol, 3,4-bis(4-hydroxyphenyl)hexane, 1,3-bis(4-hydroxycumyl)benzene (also referred to as "bisphenol M"), 1,4-bis(4-hydroxycumyl)benzene (also referred to as "bisphenol P"), 4,4'-(phenylphosphinylidene)bisphenol, 4,4'-(tetrafluoroisopropylidene)bisphenol (also referred to as "bisphenol AF"), 4,4'-isopropylidenebis(3,5-dibromophenol) (also referred to as "tetrabromobisphenol A"), reaction product between dicyclopentadiene and phenol, and 4,4'-oxybis(ethylenethio)diphenol;

triphenol compounds such as tris(4-hydroxyphenyl)methane (also referred to as "trisphenol PHBA"), 1,1,3-tris(4-hydroxyphenyl)propane (also referred to as "trisphenol PA"), 4,4'-[1-{4-(4-hydroxyphenylisopropylidene)phenyl}ethylidene]bisphenol, 2,4,6-tris(4-hydroxyphenoxy)-1,3,5-triazine and 2,4,6-tris(4-hydroxyphenyl)amino-s-triazine;

tetraphenol compounds such as 1,1,2,2-tetrakis(4-hydroxyphenyl)ethane, 1,4-bis[bis(4-hydroxyphenyl)methyl]benzene, 1,4-bis[α,α-bis(4-hydroxyphenyl)benzyl]benzene, bis[4,4-bis(4-hydroxyphenyl)cyclohexane] and isopropylidenebis[4,4-bis(4-hydroxyphenyl)cyclohexane];

naphthol compounds such as 1,1'-binaphthalene-2,2'-diol, 2,2'-binaphthalene-1,1'-diol and 1,1'-thiobis-2-naphthol; phenol novolac compounds; cresol novolac compounds; and hydroxystyrene oligomers.

Among these compounds, cyclohexane diol compounds and benzene diol compounds are compounds in which the ring A is overlapping, and 1,2,3,4-tetrahydronaphthalene-1,5-diol, 1,5-decalin diol and the like are compounds in which the ring A is partially overlapping.

When the compound having two partial structures represented by the Formula (1a) in the molecule is a compound represented by the above-described Formula (2a) or (3a), the component (A) of the curable composition of the present invention is a compound represented by the following Formula (2) or (3):

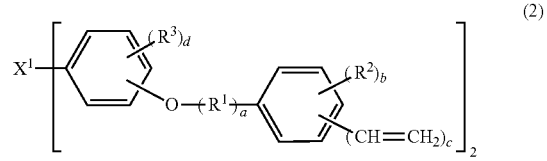

(wherein, $R^1$, $R^2$, a, b and c have the same meanings as in the Formula (1); and $R^3$, d and $X^1$ have the same meanings as in the Formula (2a))

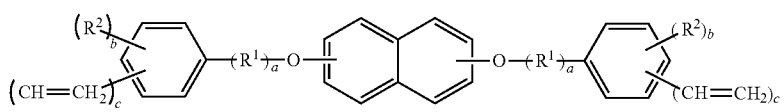

(wherein, $R^1$, $R^2$, a, b and c have the same meanings as in the Formula (1)).

Next, a method of synthesizing the component (A) of the present invention will be described. The method of synthesizing the component (A) is not particularly restricted and, for example, in cases where a in the above-described Formula (1) is 1, the component (A) may be synthesized by allowing a compound having at least two partial structures represented by the above-described Formula (1a) in the molecule and a halogen compound represented by the following Formula (1c) to undergo an etherification reaction in accordance with the Williamson method, which is a commonly used ether synthesis method:

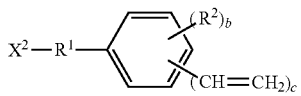

(1c)

(wherein, $X^2$ represents a halogen atom; and $R^1$, $R^2$, b and c have the same meanings as in the Formula (1)).

In the Formula (1c), $X^2$ represents a halogen atom, and $R^1$, $R^2$, b and c have the same meanings as in the Formula (1). Examples of the halogen atom include a chlorine atom, a bromine atom and an iodine atom and, from the standpoints of good reactivity and material availability, $X^2$ is preferably a chlorine atom or a bromine atom, more preferably a chlorine atom.

Next, the component (B) of the present invention, which is a thermal radical generator, will be described. In the present invention, the term "thermal radical generator" refers to a compound which generates a radical by the action of heat, and examples thereof include organic peroxide-based thermal radical generators and azo compound-based thermal radical generators.

Examples of the organic peroxide-based thermal radical generators include diisobutyryl peroxide, cumylperoxy neodecanoate, 3-hydroxy-1,1-dimethylbutylperoxy neodecanoate, dipropylperoxy dicarbonate, diisopropylperoxy dicarbonate, di-sec-butylperoxy dicarbonate, 1,1,3,3-tetramethylbutylperoxy neodecanoate, bis(4-t-butylcyclohexyl) peroxy dicarbonate, bis(2-ethylhexyl)peroxy dicarbonate, t-hexylperoxy neodecanoate, t-butylperoxy neodecanoate, t-butylperoxy neoheptanoate, t-heptylperoxy pivalate, t-butylperoxy pivalate, t-pentylperoxy pivalate, bis(3,5,5-trimethylhexanoyl)peroxide, dilauroyl peroxide, 1,1,3,3-tetramethylbutylperoxy-2-ethyl hexanoate, disuccinic acid peroxide, 1,1,3,3-tetramethylbutylperoxy-2-ethyl hexanoate, t-pentylperoxy-2-ethyl hexanoate, t-butylperoxy-2-ethyl hexanoate, 1,1-di(t-hexylperoxy)cyclohexane, 1,1-di(t-butylperoxy)cyclohexane, 1,1-di(t-pentylperoxy)cyclohexane, 2,2-bis(4,4-di(t-butylperoxy)cyclohexyl propane, t-hexylperoxyisopropyl monocarbonate, t-pentylperoxyisopropyl carbonate, t-pentylperoxy-n-octoate, t-butylperoxy maleate, 1,1-di(t-butylperoxy)cyclohexane, t-butylperoxy-3,5,5-trimethyl hexanoate, t-butylperoxy laurate, t-butylperoxyisopropyl monohexanoate, t-pentylperoxy-2-ethylhexyl carbonate, t-butylperoxy-2-ethylhexyl monohexanoate, t-hexylperoxy benzoate, t-pentylperoxy acetate, 2,5-dimethyl-2,5-di(benzoylperoxy)hexane, t-butylperoxy acetate, 2,2-di(t-butylperoxy)butane, t-butylperoxy benzoate, butyl-4,4-di(t-butylperoxy)valerate, ethyl-3,3-di(t-butylperoxy)butyrate, bis(2-t-butylperoxyisopropyl)benzene, dicumyl peroxide, di-t-hexyl peroxide, 2,5-dimethyl-2,5-di(t-butylperoxy)hexane, di-t-butyl peroxide, t-butylperoxy isobutyrate and 2,5-dimethyl-2,5-di(t-butylperoxy)hexane.

Examples of the azo compound-based thermal radical generators include 2,2'-azobis(4-methoxy-2,4-dimethylvaleronitrile), 2,2'-azobis(2,4-dimethylvaleronitrile), 2,2'-azobis(2-methylbutyronitrile), 1,1'-azobis(cyclohexyl-1-carbonitrile), 2,2'-azobis(N-(2-propyl)-2-methylpropionamide), 1-((1-cyano-1-methylethyl)azo)formamide, 2,2'-azobis(N-butyl-2-methylpropionamide), 2,2'-azobis(N-cyclohexyl-2-methylpropionamide) and 2,2'-azobis-isobutyronitrile.

From the standpoints of allowing the curable composition to have good storage stability and obtaining a cured article having a high Tg, it is preferred that the component (B) of the present invention be an organic peroxide-based thermal radical generator. The organic peroxide-based thermal radical generator may be appropriately selected in accordance with the processing temperature of the curable composition of the present invention and, for example, in cases where the curable composition of the present invention is molded by transfer molding, the organic peroxide-based thermal radical generator has a 1-minute half-life temperature of preferably 140 to 200° C., more preferably 150 to 180° C.

In the curable composition of the present invention, the amount of the component (B) to be blended is 0.5 to 3 parts by mass with respect to 100 parts by mass of the component (A). When the amount of the component (B) is less than 0.5 parts by mass, a cured article having a high Tg may not be obtained, while when the amount is greater than 3 parts by mass, the physical properties of the resulting cured article, such as hardness and elasticity, may be adversely affected. The amount of the component (B) to be blended is preferably 0.6 to 2.5 parts by mass, more preferably 0.7 to 2 parts by mass, most preferably 0.8 to 1.5 parts by mass, with respect to 100 parts by mass of the component (A).

Many of the compounds of the component (A) of the present invention have a high melting point, so that there may be a problem in terms of the workability of the curable composition of the present invention. Therefore, in the curable composition of the present invention, in order to lower its softening point, as a component (C), other radical-reactive compound may also be incorporated in an amount of 0 to 50 parts by mass with respect to 100 parts by mass of the component (A). In the present invention, the term "other radical-reactive compound" refers to a compound which has radical reactivity and is different from the compound of the component (A) that has at least two partial structures represented by the above-described Formula (1) in the molecule. As such other radical-reactive compound, a compound having at least two radical-reactive groups, preferably ethylenically unsaturated bonds, in the molecule is preferred since such a compound causes only a small reduction in the mechanical and physical properties of the cured article of the present invention.

Examples of compounds that are preferred as the component (C) include divinylbenzene, trivinylbenzene, 2,3-divinyl naphthalene, 2,3-divinylpyridine, diallyl phthalate, triallyl trimellitate, tetraallyl pyromellitate, diallyl tetrahydrophthalate, diallyl hexahydrophthalate, 2,3-divinyl-2-cyclohexene-1-ol, diethylene glycol bis(allyl carbonate), trimethylolpropane diallyl ether, trimethylolpropane trimethacrylate, trimethylolpropane triacrylate, 1,1,2,2-tetraallyloxy ethane, diallylidene pentaerythritol, triallyl cyanurate, triallyl isocyanurate, glycidyldiallyl isocyanurate, diallyl ether of 2,2-bis(4-hydroxycyclohexyl)propane, 1,4-divinylcyclohexane, 1,2,4-trivinylcyclohexane, divinylbiphenyl, 1,3-diisopropenyl benzene, 1,4-diisopropenyl benzene, 3,3'-diallyl bisphenol A, 3,5,3',5'-tetraallyl bisphenol A, 1,2-bis(dimethylvinylsilyl)benzene, 1,3-bis(dimethylvinylsilyl)benzene, 1,4-bis(dimethylvinylsilyl)benzene, 1,1,3,3-tetraphenyl-1,3-divinyl disiloxane and 1,1,5,5-tetramethyl-3,3-diphenyl-1,5-divinyl trisiloxane. Thereamong, from the standpoint of allowing the curable composition of the present invention to have good storage stability and because of good reactivity with the component (A), diallyl phthalate, triallyl trimellitate, tetraallyl pyromellitate, diallyl tetrahydrophthalate, diallyl hexahydrophthalate, triallyl cyanurate, triallyl isocyanurate, glycidyldiallyl isocyanurate, 1,4-divinylcyclohexane, 1,2,4-trivinylcyclohexane, 3,3'-diallyl bisphenol A, 3,3',5,5'-tetraallyl bisphenol A, 1,2-bis(dimethylvinylsilyl)benzene, 1,3-bis (dimethylvinylsilyl)benzene, 1,4-bis(dimethylvinylsilyl) benzene, 1,1,3,3-tetraphenyl-1,3-divinyl disiloxane and 1,1, 5,5-tetramethyl-3,3-diphenyl-1,5-divinyl trisiloxane triallyl isocyanurate are preferred; diallyl phthalate, triallyl cyanurate, triallyl isocyanurate, 3,3'-diallyl bisphenol A, 3,3',5,5'-tetraallyl bisphenol A, 1,4-bis(dimethylvinylsilyl)benzene, 1,1,3,3-tetraphenyl-1,3-divinyl disiloxane and 1,1,5,5-tetramethyl-3,3-diphenyl-1,5-divinyl trisiloxane are more preferred; and triallyl isocyanurate is most preferred.

The component (C) may be blended in such an amount that the curable composition of the present invention has a softening point at which molding thereof is easily carried out as long as the amount is 50 parts by mass or less with respect to 100 parts by mass of the component (A). When the amount of the component (C) is excessively large, the physical properties of the resulting cured article of the curable composition of the present invention may be deteriorated. Therefore, the amount of the component (C) is preferably 0 to 30 parts by mass, more preferably 0 to 20 parts by mass, with respect to 100 parts by mass of the component (A).

It is preferred that the curable composition of the present invention further comprise a filler as a component (D) since it can improve the mechanical strength, heat resistance and the like of the resulting cured article and reduce the thermal expansion coefficient. Examples of the filler include silica-based inorganic fillers such as quartz, fumed silica, precipitated silica, silicic acid anhydride, molten silica, crystalline silica and ultrafine powder amorphous silica; inorganic layered substances such as magadiite, montmorillonite, saponite, kaolinite, ilerite and mica; fibrous fillers such as aramid fibers, silicon carbide fibers, ceramic fibers, asbestos fibers, gypsum fibers, metal fibers, glass fibers, alumina fibers and carbon fibers; nitride-based inorganic fillers such as silicon nitride, boron nitride and aluminum nitride; metal oxide-based inorganic fillers such as titanium oxide, zinc oxide, zirconium oxide, niobium oxide, aluminum oxide, cerium oxide and yttrium oxide; carbon-based inorganic fillers such as silicon carbide, black lead, diamond, carbon blacks and graphites; metal powders such as copper powder, aluminum powder, nickel powder and silver powder; carbonates such as calcium carbonate, magnesium carbonate and dolomite; silicates such as alumina silicate and magnesium silicate; sulfates such as calcium sulfate and barium sulfate; potassium titanate; barium titanate; aluminum borate; aluminum hydroxide; diatomaceous earth; white earth; clay; talc; wollastonite; zeolite; sericite; kaolin; pyrophyllite; bentonite; asbestos; glass beads; glass flakes; and ceramic beads. Thereamong, from the standpoint of obtaining a cured article having a low thermal expansion coefficient, silica-based inorganic fillers, aluminum oxide and aluminum nitride are preferred; silica-based inorganic fillers are more preferred; and molten silica is most preferred. The shape of the filler is preferably spherical and the particle size is preferably in the range of 10 to 50 μm since such a filler allows the curable composition of the present invention to have good fluidity.

When the amount of the component (D) contained in the curable composition of the present invention is excessively large, there may be adverse effects on the strength, bending elasticity and the like of the cured article of the present invention; therefore, the amount of the component (D) to be contained is preferably 10 to 85 parts by mass, more preferably 20 to 80 parts by mass, with respect to 100 parts by mass of the curable composition of the present invention.

In the curable composition of the present invention, in addition to the components (A) to (D), an additive(s) imparting weather resistance, physical stability, mold-releasing property, storage stability and the like can be used as well. Examples of such additives include antioxidants, ultraviolet absorbers, hindered amine-based light stabilizers, flame retardants, silane coupling agents and mold-releasing agents. In cases where such additive(s) is/are blended, the amount thereof can be appropriately selected in accordance with the intended purpose and the like of each additive; however, from the standpoint of not adversely affecting the effects of the present invention, the total amount of all additives is preferably in the range of 10 parts by mass or less with respect to 100 parts by mass of the curable composition of the present invention.

An antioxidant is an additive which inhibits oxidation and imparts heat resistance and weather resistance, and examples thereof include phenol-based antioxidants, phosphorus-based antioxidants and thioether-based antioxidants. Examples of the phenol-based antioxidants include 2,6-di-t-butylphenol, 2,6-di-t-butyl-p-cresol, 2,6-diphenyl-4-octadecyloxy phenol, distearyl(3,5-di-t-4-hydroxybenzyl)phosphonate, 1,6-hexamethylenebis[(3,5-di-t-4-hydroxyphenyl) propionic acid amide], 4,4'-thiobis(6-t-butyl-m-cresol), 2,2'-methylenebis(4-methyl-6-t-butylphenol), 2,2'-methylenebis (4-ethyl-6-t-butylphenol), 4,4'-butylidenebis(6-t-butyl-m-cresol), 2,2'-ethylidenebis(4,6-di-t-butylphenol), 2,2'-ethylidenebis(4-sec-butyl-6-t-butylphenol), 1,1,3-tris(2-methyl-4-hydroxy-5-t-butylphenyl)butane, 1,3,5-tris(2,6-dimethyl-3-hydroxy-4-t-butylbenzyl)isocyanurate, 1,3,5-tris (3,5-di-t-butyl-4-hydroxybenzyl)isocyanurate, 1,3,5-tris(3, 5-di-t-butyl-4-hydroxybenzyl)-2,4,6-trimethylbenzene, 2-t-butyl-4-methyl-6-(2-acryloyloxy-3-t-butyl-5-methylbenzyl) phenol, stearyl(3,5-di-t-butyl-4-hydroxyphenyl)propionate, thiodiethylene glycol-bis[(3,5-di-t-butyl-4-hydroxyphenyl) propionate], 1,6-hexamethylenebis[(3,5-di-t-butyl-4-hydroxyphenyl)propionate], bis[3,3-bis(4-hydroxy-3-t-butylphenyl)butyric acid]glycol ester, bis[2-t-butyl-4-methyl-6-(2-hydroxy-3-t-butyl-5-methylbenzyl)phenyl] terephthalate, 1,3,5-tris[(3,5-di-t-butyl-4-hydroxyphenyl) propionyloxyethyl]isocyanurate, 3,9-bis[1,1-dimethyl-2-{(3-t-butyl-4-hydroxy-5-methylphenyl) propionyloxy}ethyl]-2,4,8,10-tetraoxaspiro[5.5]undecane and triethylene glycol-bis[(3-t-butyl-4-hydroxy-5-methylphenyl)propionate].

Examples of the phosphorus-based antioxidants include [2-t-butyl-4-(3-t-butyl-4-hydroxy-5-methylphenylthio)-5-methylphenyl]phosphite, tridecyl phosphite, octyldiphenyl phosphite, di(decyl)monophenyl phosphite, di(tridecyl)pentaerythritol diphosphite, di(nonylphenyl)pentaerythritol diphosphite, bis(2,4-di-t-butylphenyl)pentaerythritol diphosphite, bis(2,6-di-t-butyl-4-methylphenyl)pentaerythritol diphosphite, bis(2,4,6-tri-t-butylphenyl)pentaerythritol diphosphite, bis(2,4-dicumylphenyl)pentaerythritol di phosphite, tetra(tridecyl)isopropylidene diphenol diphosphite, tetra(tridecyl)-4,4'-n-butylidenebis(2-t-butyl-5-methylphenol)diphosphite, hexa(tridecyl)-1,1,3-tris(2-methyl-4-hydroxy-5t-butylphenyl)butane triphosphite, tetrakis(2,4-di-t-butylphenyl)biphenylene diphosphonite, 9,10-dihydro-9-oxa-10-phosphaphenanthrene-10-oxide, 2,2'-methylenebis (4,6-t-butylphenyl)-2-ethylhexyl phosphite, 2,2'-methylenebis(4,6-t-butylphenyl)-octadecyl phosphite, 2,2'-ethylidenebis(4,6-di-t-butylphenyl)fluorophosphite, 2-ethyl-2-butyl propylene glycol and 2,4,6-tri-t-butyl phenol.

Examples of the thioether-based antioxidants include dialkyl thiodipropionates such as dilauryl thiodipropionate, dimyristyl thiodipropionate and distearyl thiodipropionate; and β-alkylmercaptopropionic acid esters of polyols, such as pentaerythritol tetra(β-dodecylmercaptopropionate).

The amount of the antioxidant(s) to be blended is preferably 0.001 to 10 parts by mass, more preferably 0.05 to 5 parts by mass, with respect to 100 parts by mass of the curable composition of the present invention. It is noted here that the phenol-based antioxidants also have an effect of improving the storage stability of the curable composition of the present invention.

An ultraviolet absorber is an additive which absorbs ultraviolet radiation and imparts weather resistance, and examples thereof include benzotriazole-based ultraviolet absorbers, triazine-based ultraviolet absorbers and benzophenone-based ultraviolet absorber.

Examples of the benzotriazole-based ultraviolet absorbers include 2-(2'-hydroxy-5'-methylphenyl)benzotriazole, 2-(2'-hydroxy-3',5'-di-t-butylphenyl)-5-chlorobenzotriazole, 2-(2'-hydroxy-3'-t-butyl-5'-methylphenyl)-5-chlorobenzotriazole, 2-(2'-hydroxy-5'-t-octylphenyl)benzotriazole, 2-(2'-hydroxy-3',5'-dicumylphenyl)benzotriazole, 2-(2'-hydroxy-3'-t-butyl-5'-carboxyphenyl)benzotriazole and 2,2'-methylenebis(4-t-octyl-6-benzotriazolyl)phenol.

Examples of the triazine-based ultraviolet absorbers include 2-(2-hydroxy-4-octoxyphenyl)-4,6-bis(2,4-dimethylphenyl)-s-triazine, 2-(2-hydroxy-4-hexyloxyphenyl)-4,6-diphenyl-s-triazine, 2-(2-hydroxy-4-propoxy-5-methylphenyl)-4,6-bis(2,4-dimethylphenyl)-s-triazine, 2-(2-hydroxy-4-hexyloxyphenyl)-4,6-dibiphenyl-s-triazine, 2,4-bis(2-hydroxy-4-octoxyphenyl)-6-(2,4-dimethylphenyl)-s-triazine and 2,4,6-tris(2-hydroxy-4-octoxyphenyl)-s-triazine.

Examples of the benzophenone-based ultraviolet absorbers include 2,4-dihydroxy benzophenone, 2-hydroxy-4-methoxy benzophenone, 2-hydroxy-4-octoxy benzophenone and 5,5'-methylenebis(2-hydroxy-4-methoxybenzophenone).

The amount of the above-described ultraviolet absorber(s) to be blended is preferably 0.01 to 10 parts by mass, more preferably 0.05 to 5 parts by mass, with respect to 100 parts by mass of the curable composition of the present invention.

A hindered amine-based light stabilizer is an additive which traps radicals generated by ultraviolet radiation and the like and imparts weather resistance, and examples thereof include 2,2,6,6-tetramethyl-4-piperidyl stearate, 1,2,2,6,6-pentamethyl-4-piperidyl stearate, 2,2,6,6-tetramethyl-4-piperidyl benzoate, bis(2,2,6,6-tetramethyl-4-piperidyl)sebacate, bis(1,2,2,6,6-pentamethyl-4-piperidyl)sebacate, bis(1-octoxy-2,2,6,6-tetramethyl-4-piperidyl)sebacate, 1,2,2,6,6-pentamethyl-4-piperidyl methacrylate, 2,2,6,6-tetramethyl-piperidyl methacrylate, tetrakis(2,2,6,6-tetramethyl-4-piperidyl)-1,2,3,4-butane tetracarboxylate, tetrakis(1,2,2,6,6-pentamethyl-4-piperidyl)-1,2,3,4-butane tetracarboxylate, bis(2,2,6,6-tetramethyl-4-piperidyl).bis(tridecyl)-1,2,3,4-butane tetracarboxylate, bis(1,2,2,6,6-pentamethyl-4-piperidyl).bis(tridecyl)-1,2,3,4-butane tetracarboxylate, bis(1,2,2,6,6-pentamethyl-4-piperidyl)-2-butyl-2-(3,5-di-t-butyl-4-hydroxybenzyl)malonate, 3,9-bis[1,1-dimethyl-2-[tris(2,2,6,6-tetramethyl-4-piperidyloxycarbonyloxy)butylcarbonyloxy]ethyl]-2,4,8,10-tetraoxaspiro[5.5]undecane, 3,9-bis[1,1-dimethyl-2-[tris(1,2,2,6,6-pentamethyl-4-piperidyloxycarbonyloxy)butylcarbonyloxy]ethyl]-2,4,8,10-tetraoxaspiro[5.5]undecane, 1,6-bis(2,2,6,6-tetramethyl-4-piperidylamino)hexane/2,4-dichloro-6-morpholino-s-triazine polycondensate, 1,6-bis(2,2,6,6-tetramethyl-4-piperidylamino)hexane/2,4-dichloro-6-t-octylamino-s-triazine polycondensate, 1,5,8,12-tetrakis[2,4-bis(N-butyl-N-(2,2,6,6-tetramethyl-4-piperidypamino)-s-triazine-6-yl]-1,5,8,12-tetraazadodecane, 1,5,8,12-tetrakis[2,4-bis(N-butyl-N-(1,2,2,6,6-pentamethyl-4-piperidyl)amino)-s-triazine-6-yl]-1,5,8,12-tetraazadodecane, 1,6,11-tris[2,4-bis(N-butyl-N-(2,2,6,6-tetramethyl-4-piperidyl)amino)-s-triazine-6-ylamino]undecane, 1,6,11-tris[2,4-bis(N-butyl-N-(1,2,2,6,6-pentamethyl-4-piperidypamino)-s-triazine-6-ylamino]undecane, 1-(2-hydroxyethyl)-2,2,6,6-tetramethyl-4-piperidinol/diethylsuccinate polycondensate and 1,6-bis(2,2,6,6-tetramethyl-4-piperidylamino)hexane/dibromoethane polycondensate.

The amount of the above-described hindered amine-based light stabilizer(s) to be blended is preferably 0.001 to 10 parts by mass with respect to 100 parts by mass of the curable composition of the present invention.

A flame retardant is an additive which imparts flame retardancy to a resin. Examples thereof include phosphate compounds such as triphenyl phosphate, phenol-resorcinol-phosphorus oxychloride condensate, phenol-bisphenol A-phosphorus oxychloride condensate and 2,6-xylenol-resorcinol-phosphorus oxychloride condensate; phosphoric acid amide compounds such as aniline-phosphorus oxychloride condensate and phenol-xylylene diamine-phosphorus oxychloride condensate; phosphazenes; halogen-based flame retardants such as decabromodiphenyl ether and tetrabromobisphenol A; phosphates of nitrogen-containing organic compounds, such as melamine phosphate, piperazine phosphate, melamine pyrophosphate, piperazine pyrophosphate, melamine polyphosphate and piperazine polyphosphate; red phosphorus and surface-treated or microcapsulated red phosphorus; flame retardant aids such as antimony oxide and zinc borate; and anti-drip agents such as polytetrafluoroethylenes and silicon resins.

The amount of the flame retardant(s) to be blended is preferably 2 to 20 parts by mass, more preferably 5 to 10 parts by mass, with respect to 100 parts by mass of the curable composition of the present invention.

A silane coupling agent is a component which improves the adhesiveness of the resulting cured article. Examples thereof include 3-chloropropyltrimethoxysilane, vinyltrichlorosilane, vinyltriethoxysilane, vinyl-tris-(2-methoxyethoxy)silane, 3-methacryloxypropyltrimethoxysilane, 2-(3,4-ethoxycyclohexyl)ethyltrimethoxysilane, 3-glycidoxypropyltrimethoxysilane, vinyltriacetoxysilane, 3-mercaptopropyltrimethoxysilane, 3-aminopropyltrimethoxysilane and N-2-(aminoethyl)-3-aminopropyltrimethoxy silane.

The amount of the silane coupling agent(s) to be blended is preferably 0.01 to 5 parts by mass, more preferably 0.1 to 2 parts by mass, with respect to 100 parts by mass of the curable composition of the present invention.

A mold-releasing agent is a component which improves the mold-releasing from a die at the time of molding. Examples thereof include carnauba wax, montanoic acid, higher fatty acids such as stearic acid, metal salts of higher fatty acids, ester-based waxes such as montanic acid ester, oxidized polyolefin-based waxes such as oxidized polyethylene, and non-oxidized polyolefin-based waxes such as non-oxidized polyethylene. These mold-releasing agents may be used individually, or two or more thereof may be used in combination. Among these mold-releasing agents, it is preferred to use an oxidized polyolefin-based wax or a non-oxidized polyolefin-based wax in an amount of 0.01 to 10 parts by mass, more preferably 0.1 to 5 parts by mass, with respect to 100 parts by mass of the curable composition of the present invention.

The curable composition of the present invention can be cured by an active energy beam such as ultraviolet radiation, electron beam, X-ray, radiation or high-frequency wave when a photoradical generator is used as the component (B) or by heating when a thermal radical generator is used as the component (B). It is preferred that the curable composition of the present invention be cured by heating since it has excellent molding processability into a three-dimensional molded article. Various curing temperatures can be set by selecting the type of the thermal radical generator; however, when the curing temperature is excessively low, the storage stability of the curable composition of the present invention may become poor and there may arise a problem in the workability due to an increase in the time required for curing, while when the curing temperature is excessively high, the dimensional accuracy of molding in the present invention may become poor. Therefore, the curing temperature of the curable composition of the present invention is preferably 100 to 250° C., more preferably 150 to 200° C.

The curable composition of the present invention can be molded by a molding method known as a method of molding a thermosetting resin, such as compression molding, transfer molding, injection molding, extrusion molding, casting or RIM molding. Thereamong, transfer molding is preferred since the curable composition of the present invention has excellent molding processability into a three-dimensional object. Further, the curable composition of the present invention, after being cured, may also be subjected to post-curing (after-curing) as required. By performing post-curing, a curing reaction proceeds further, so that the physical strength and heat resistance of the resulting cured article of the curable composition of the present invention are improved.

In cases where the curable composition of the present invention is molded by transfer molding, the curable composition of the present invention may be used as is; however, it is preferably processed into a tablet before use since thereby air bubbles are less likely to be entrapped and a good-quality cured article can be obtained. In cases where the curable composition of the present invention is processed into a tablet, the components of the curable composition of the present invention may be loaded all together to a dissolving bath and then melt-mixed batchwise, or the components may be loaded all together to a kneader such as a heated 3-roll mill and then melt-mixed continuously. The shape of the tablet is not particularly restricted and it may be adjusted to the specifications of the transfer molding machine in which the curable composition of the present invention is used.

The curable composition of the present invention is excellent in terms of molding processability, particularly molding processability in transfer molding. The curable composition of the present invention can thus be suitably used as a molding material for a semiconductor element. Examples of a semiconductor element in which the curable composition of the present invention is suitably used include integrated circuits such as ICs and LSIs; optical semiconductor elements such as light-emitting diodes (LEDs), organic electroluminescent elements (organic ELs), laser diodes, LED arrays and CCDs; and SiC power semiconductors. Since a cured article of the curable composition of the present invention has high heat resistance, it is particularly preferably used as a molding material for a power semiconductor or power module where high-level heat resistance is required, particularly as a molding material for a SiC power semiconductor or SiC power module. Examples of a power semiconductor in which the curable composition of the present invention is used as a molding material include GTO (Gate Turn Off) thyristors, insulated gate bipolar transistors (IGBTs), metal oxide semiconductor field-effect transistors (MOSFETs), static induction transistors (SITs), diodes, power transistors, thyristors and triacs. Further, examples of a power module include general-purpose inverter modules, IPMs (Intelligent Power Modules) and inverter modules for automobiles. These power semiconductors and power modules can be used in railcars, heavy electric plants, hybrid cars, electric cars, robot welders, elevators, air conditioners, uninterruptible power supplies (UPS), general-purpose inverters (control units of general-purpose motors), washing machines, microwave ovens, electromagnetic ranges, electric fans, refrigerators, electric rice-cookers, VTRs, audio instruments and the like.

In addition to the above, the curable composition of the present invention can also be suitably used, for example, as an insulating material of a semiconductor element and a substrate of a printed circuit board or the like, as well as in the chassis and parts of electrical products and electrical/electronic equipments and parts of automobiles, railcars, airplanes and the like.

EXAMPLES

The present invention will now be described in more detail by way of examples and comparative examples thereof. However, the present invention is not restricted thereto by any means. It is noted here that, in the following Examples, "part(s)" and "%" are based on mass unless otherwise specified.

Production Example 1

Synthesis of Compound A1

To a glass reaction vessel equipped with an agitator, a thermometer, a nitrogen-introducing tube, a dropping funnel and a condenser tube, 549 g of 4,4'-(1-phenylethylidene) bisphenol (1.89 mol, manufactured by Honshu Chemical Industry Co., Ltd.), 1.4 kg of methanol, 266 g (4.75 mol) of potassium hydroxide and 691 g (4.53 mol) of chloromethyl-styrene were added and stirred at 60° C. for 1 hour. Then, after terminating the stirring, the resultant was allowed to separate into two layers and the lower layer was removed. The upper layer was cooled and purified by recrystallization to obtain 613 g of a compound A1 as white solid (yield: 62%). The thus obtained compound A1 had the following structure and a melting point of 102° C.

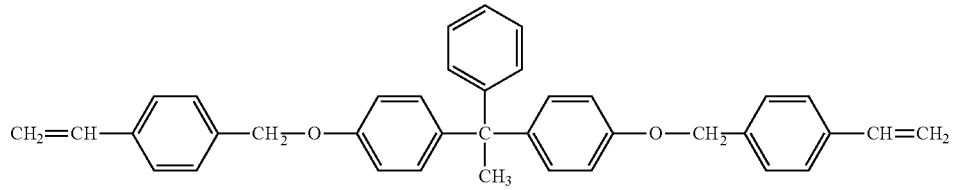 [SMILES: C=Cc1ccc(COc2ccc(C(C)(c3ccccc3)c3ccc(OCc4ccc(C=C)cc4)cc3)cc2)cc1]

Production Example 2

Synthesis of Compound A2

A compound A2 was obtained as white solid by performing the same operations as in Production Example 1, except that biphenyl-2,2'-diol was used in place of 4,4'-(1-phenylethylidene)bisphenol. The thus obtained compound A2 had the following structure and a melting point of 98° C.

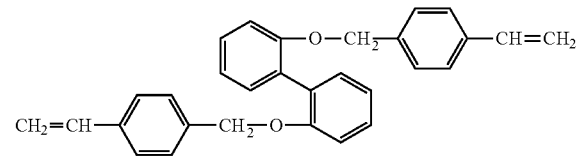 [SMILES: C=Cc1ccc(COc2ccccc2-c2ccccc2OCc2ccc(C=C)cc2)cc1]

Production Example 3

Synthesis of Compound A3

A compound A3 was obtained as white solid by performing the same operations as in Production Example 1, except that 1,6-naphthalene diol was used in place of 4,4'-(1-phenylethylidene)bisphenol. The thus obtained compound A3 had the following structure and a melting point of 122° C.

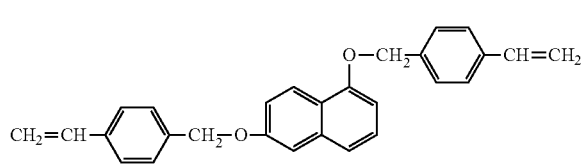 [SMILES: C=Cc1ccc(COc2ccc3c(OCc4ccc(C=C)cc4)cccc3c2)cc1]

Production Example 4

Synthesis of Compound A4

A compound A4 was obtained as white solid by performing the same operations as in Production Example 1, except that 4,4'-dihydroxydiphenyl sulfide was used in place of 4,4'-(1-phenylethylidene)bisphenol. The thus obtained compound A4 had the following structure and a melting point of 170° C.

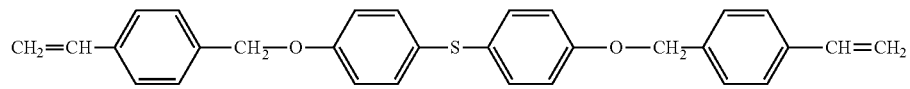

Production Example 5

Synthesis of Compound A5

A compound A5 was obtained as white solid by performing the same operations as in Production Example 1, except that 4,4'-dihydroxydiphenyl sulfone was used in place of 4,4'-(1-phenylethylidene)bisphenol. The thus obtained compound A5 had the following structure and a melting point of 121° C.

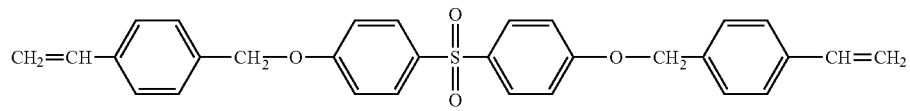

Curable Resin Components for Comparison a1: epoxy resin (manufactured by Sigma-Aldrich Co. LLC, poly[(o-cresylglycidylether)-CO-formaldehyde], number-average molecular weight (Mn): ~870)

a2: phenol resin (manufactured by Gun Ei Chemical Industry Co., Ltd., trade name: PSM4326)

Component (B)

B1: dicumyl peroxide (manufactured by NOF Corporation, trade name: PERCUMYL D)

Component (C)

C1: triallyl isocyanurate (manufactured by Nippon Kasei Chemical Company Limited, trade name: TAIC)

Component (D)

D1: spherical silica (manufactured by Tokuyama Corporation, trade name: SE-40, average particle size: 40 μm)

D2: spherical silica (manufactured by Admatechs Company Limited, trade name: SO-E5, average particle size: 15 μm)

D3: molten silica (manufactured by DENKI KAGAKU KOGYO KABUSHIKI KAISHA, trade name: FB-950, average particle size: 24 μm)

Antioxidant

E1: 2,6-di-t-butyl phenol

[Tablet Preparation]

Using the thus obtained compounds A1 to A5 and the above-described compounds, tablets having the respective formulations shown in Table 1 and 2 were prepared by the following steps. It is noted here that, in these Tables, all numerical values are based on parts by mass.

(1) Melt-mixing the components other than the components (B) and (D).

(2) Using a mixer, knead the resulting mixture and the components (B) and (D) at 100° C. for 30 minutes.

(3) Cool and pulverize the kneaded product.

(4) Using a tablet machine (manufactured by Oji Kikai Co., Ltd., OTM-10-80), mold the resultant into a tablet of 15 mm in diameter and 18 mm in height (mass: about 25 g).

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| A1 | 100 | 100 | 100 | 100 | 100 | 50 | — | 70 | — | — |
| A2 | — | — | — | — | — | 50 | — | — | — | — |
| A3 | — | — | — | — | — | — | 100 | — | — | — |
| A4 | — | — | — | — | — | — | — | 30 | 50 | 50 |
| A5 | — | — | — | — | — | — | — | — | 50 | 50 |
| B1 | 1.1 | 0.7 | 2.2 | 1.1 | 1.1 | 1.1 | 1.1 | 1.1 | 1.1 | 0.6 |
| C1 | 11 | 11 | 11 | 11 | — | — | 11 | 11 | 11 | 11 |
| D1 | 444 | 444 | 444 | — | — | — | — | — | — | — |
| D2 | 185 | 185 | 185 | — | — | — | — | — | — | — |
| D3 | — | — | — | — | 604 | 604 | 604 | 604 | 604 | 604 |
| E1 | — | — | 0.3 | 0.3 | 0.3 | 0.3 | 0.3 | 0.3 | 0.3 | — |

TABLE 2

| | Comparative Example | | | | | |
|---|---|---|---|---|---|---|
| | 1 | 2 | 3 | 4 | 5 | 6 |
| A1 | — | — | 100 | 100 | 100 | — |
| A4 | — | — | — | — | — | 50 |
| A5 | — | — | — | — | — | 50 |
| a1 | 100 | 100 | — | — | — | — |
| a2 | 36 | 36 | — | — | — | — |
| B1 | — | — | 0.1 | 0.4 | 0.3 | 0.3 |
| C1 | 545 | — | 11 | 11 | — | 11 |
| D1 | 227 | — | 444 | 444 | — | — |
| D2 | — | 741 | 185 | 185 | — | — |
| D3 | — | — | — | — | 604 | 604 |
| E1 | — | — | — | — | 0.3 | — |

[Spiral Flow]

Using a transfer molding machine (manufactured by Kodaira Seisakusho Co., Ltd., model: SP-T-10), the spiral flow length of each tablet was measured under the following conditions. The results thereof are shown in Table 3 and 4.

Die: spiral flow die (semicircular with a cross-sectional radius of 2.5 mm)
Extrusion pressure: 10 MPa
Die temperature: 130° C.
Injection time: 10 seconds

[Preparation of Test Piece]

Using a transfer molding machine (manufactured by Kodaira Seisakusho Co., Ltd., model: SP-T-10), each tablet was transfer-molded under the following conditions to prepare a test piece of 100 mm in length, 35 mm in width and 2 mm in thickness.

Injection Conditions
Extrusion pressure: 10 MPa
Die temperature: 130° C.
Injection time: 2 minutes
Curing Conditions
Die temperature: 150° C.
Curing time: 5 minutes
Post-curing
250° C., 30 minutes Under the below-described conditions, the heat resistance (residual weight ratio and bending modulus), linear thermal expansion coefficient, glass transition temperature and 5% weight reduction temperature were measured. The results thereof are shown in Table 3 and 4.

[Heat Resistance]

The thus obtained test pieces were each stored under an atmosphere in a 250° C. oven for 100 hours and 300 hours. Before the storage in the oven (0 hr), after 100 hours of storage (100 hr) and after 300 hours of storage (300 hr), the residual weight ratio and the bending modulus of each test piece were measured by the below-described methods.

[Residual Weight Ratio]

The mass of each test piece was measured before the storage in the oven, after 100 hours of storage and after 300 hours of storage and it was expressed in percentage, taking the mass of each test piece before the storage in the oven as 100%.

[Bending Modulus]

In accordance with JIS K6911 (Testing methods for thermosetting plastics), the bending modulus was measured using a resin universal tester (manufactured by SHIMADZU CORPORATION, model: AUTOGRAPH AG-X).

[Linear Thermal Expansion Coefficient and Glass Transition Temperature]

Using a thermomechanical analyzer (manufactured by SII NanoTechnology Inc., model: EXSTAR TMA/SS 6100), the linear thermal expansion coefficient and the glass transition temperature were measured.

[5% Weight Reduction Temperature]

After collecting 1 part of each test piece, the 5% weight reduction temperature thereof was measured under the following conditions using a differential thermogravimetric simultaneous measurement apparatus (manufactured by SII NanoTechnology Inc., model: EXSTAR TG/DTA 6300).

Measurement atmosphere: in the air
Initial heating temperature: 100° C.
Heating rate: 10° C./minute
Final heating temperature: 550° C.

TABLE 3

| | | | Example | | | | | | | | | |
|---|---|---|---|---|---|---|---|---|---|---|---|---|
| | | | 1 | 2 | 3 | 4 | 5 | 6 | 7 | 8 | 9 | 10 |
| Spiral flow (cm) | | | 104 | 104 | 103 | >150 | >150 | >150 | 98 | 90 | 110 | 110 |
| Glass transition temperature (° C.) | | | >300 | >300 | >300 | >300 | >300 | >300 | >300 | >300 | >300 | >300 |
| Linear thermal expansion coefficient (ppm/K) | $\alpha 1$*[1] | | 11 | 11 | 11 | 75 | 11 | 16 | 15 | 15 | 14 | 14 |
| | $\alpha 2$*[2] | | — | — | — | — | — | — | — | — | — | — |
| 5% weight reduction temperature (° C.) | | | 490 | 492 | 485 | 425 | 458 | 515 | 527 | 513 | 519 | 519 |
| Heat resistance | Residual weight (%) | 0 hr | 100 | 100 | 100 | 100 | 100 | 100 | 100 | 100 | 100 | 100 |
| | | 100 hr | 99.9 | 99.9 | 99.9 | 98.8 | 99.9 | 99.9 | 99.9 | 99.9 | 99.9 | 99.9 |
| | | 300 hr | 99.7 | 99.8 | 99.5 | 98.0 | 99.8 | 99.7 | 99.7 | 99.7 | 99.8 | 99.8 |
| | Bending modulus (GPa) | 0 hr | 26 | 26 | 26 | 3.5 | 25 | 26 | 28 | 27 | 24 | 24 |
| | | 100 hr | 27 | 27 | 27 | 3.5 | 26 | 26 | 28 | 28 | 24 | 24 |
| | | 300 hr | 28 | 28 | 29 | 3.5 | 26 | 28 | 29 | 29 | 25 | 25 |

*[1] $\alpha 1$ = Linear thermal expansion coefficient before reaching the glass transition temperature

*[2] $\alpha 2$ = Linear thermal expansion coefficient after reaching the glass transition temperature

TABLE 4

|  |  | Comparative Example | | | | | |
|---|---|---|---|---|---|---|---|
|  |  | 1 | 2 | 3 | 4 | 5 | 6 |
| Spiral flow (cm) | | 100 | >150 | 104 | 104 | >150 | 110 |
| Glass transition temperature (° C.) | | 124 | 126 | 208 | 221 | 218 | 229 |
| Linear thermal expansion | $\alpha 1^{*1}$ | 18 | 19 | 12 | 12 | 76 | 15 |
| coefficient (ppm/K) | $\alpha 2^{*2}$ | 61 | 64 | 54 | 53 | 109 | 55 |
| 5% weight reduction temperature (° C.) | | 459 | 455 | 482 | 485 | 412 | 488 |
| Heat resistance | Residual weight (%) 0 hr | 100 | 100 | 100 | 100 | 100 | 100 |
| | 100 hr | 99.5 | 99.4 | 99.8 | 99.8 | 98.8 | 99.9 |
| | 300 hr | 98.7 | 98.5 | 99.5 | 99.6 | 98.0 | 99.8 |
| | Bending modulus (GPa) 0 hr | 21 | 20 | 24 | 25 | 3.5 | 24 |
| | 100 hr | 21 | 20 | 25 | 26 | 3.5 | 24 |
| | 300 hr | 15 | 14 | 27 | 27 | 3.5 | 25 |

*¹α1 = Linear thermal expansion coefficient before reaching the glass transition temperature
*²α2 = Linear thermal expansion coefficient after reaching the glass transition temperature As clearly seen from Table 3, it was confirmed that the cured articles of the curable composition according to the present invention had a spiral flow equal to or higher than those of the comparative epoxy resin compositions and thus had a higher fluidity at the time of heat molding as well as superior productivity. In addition, the cured articles according to the present invention had a high residual weight ratio, a low linear expansion coefficient and a high glass transition temperature. From comparisons between Example 4 and other Examples, it was revealed that, by incorporating a filler into the curable composition of the present invention, the linear thermal expansion coefficient and the heat resistance are markedly improved. The cured articles of the present inventions have a glass transition temperature of 300° C. or higher; therefore, they can also be suitably used in SiC power semiconductors that may possibly be used at a high temperature of about 300° C. On the other hand, as clearly seen from the results of Comparative Examples 1, 2 and 3 to 6, a sufficient glass transition temperature was not attained in conventional epoxy resin compositions and those curable compositions in which the component (A) according to the present invention was used but the amount of the component (B) was less than a prescribed value.

The invention claimed is:

1. A curable composition, comprising:
a compound having a structure represented by the following Formula (2) as a component (A);
a thermal radical generator as a component (B); and
other radical-reactive compound as a component (C),
wherein Formula (2) is represent by:

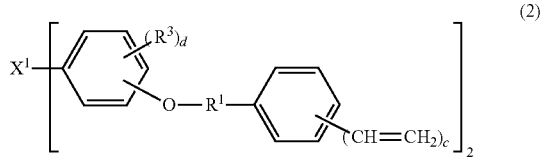

(2)

wherein, $R^1$ represents an alkylene group having 1 to 6 carbon atoms; c represents a number of 1 or 2; $R^3$ represents an alkyl group having 1 to 4 carbon atoms; d represents an integer of 0 to 2; $X^1$ represents an oxygen atom, a sulfur atom, a sulfinyl group, a sulfonyl group, a carbonyl group, a phenylene group, a cyclohexylene group (however, 1,1-cyclohexylene group is excluded), a group represented by the following Formula (4) or a direct bond;

$$\begin{array}{c} R^4 \\ | \\ -C- \\ | \\ R^5 \end{array} \quad (4)$$

wherein, $R^4$ and $R^5$ each independently represent a hydrogen atom, a trifluoromethyl group or a hydrocarbon group having 1 to 12 carbon atoms, with a proviso that, when $R^4$ and $R^5$ are hydrocarbon groups having 1 to 12 carbon atoms, $R^4$ and $R^5$ are optionally linked with each other,
wherein component (C) is selected from the group consisting of diallyl phthalate, triallyl trimellitate, tetraallyl pyromellitate, diallyl tetrahydrophthalate, diallyl hexahydrophthalate, triallyl cyanurate, triallyl isocyanurate, glycidyldiallyl isocyanurate 1,4-divinylcyclohexane, 1,2,4-trivinylcyclohexane, 3,3'-diallyl bisphenol A, 3,3',5,5'-tetraallyl bisphenol A, 1,2-bis(dimethylvinylsilyl)benzene, 1,3-bis(dimethylvinylsilyl)benzene, 1,4-bis(dimethylvinylsilyl)benzene, 1,1,3,3-tetraphenyl-1,3-divinyl disiloxane and 1,1,5,5-tetramethyl-3,3-diphenyl-1,5-divinyl trisiloxane triallyl isocyanurate,
wherein an amount of component (B) is 0.5 to 3 parts by mass with respect to 100 parts by mass of component (A),
wherein an amount of component (C) is 11 to 50 parts by mass with respect to 100 parts by mass of component (A).

2. The curable composition according to claim 1, which further comprises a filler as a component (D).

3. A tablet for transfer molding, which is composed of the curable composition according to claim 1.

4. A cured article, which is obtained by curing the curable composition according to claim 1.

5. A semiconductor element, which is obtained by molding a cured article of the curable composition according to claim 1.

6. A tablet for transfer molding, which is composed of the curable composition according to claim 2.

7. A cured article, which is obtained by curing the curable composition according to claim 2.

8. A semiconductor element, which is obtained by molding a cured article of the curable composition according to claim 2.

9. The curable composition according to claim 1, wherein $X^1$ represents an oxygen atom, a sulfur atom, a sulfonyl group, a sulfonyl group, a carbonyl group, or a cyclohexylene group (however, 1,1-cyclohexylene group is excluded).

* * * * *